United States Patent [19]
Gibbs et al.

[11] Patent Number: 5,886,523
[45] Date of Patent: Mar. 23, 1999

[54] MAGNETIC FIELD RESPONSIVE DEVICE HAVING GIANT MAGNETORESISTIVE MATERIAL AND METHOD FOR FORMING THE SAME

[75] Inventors: Michael Richard John Gibbs; Gillian Anne Gehring; Harry Jarratt Blythe, all of Sheffield, United Kingdom

[73] Assignee: University of Sheffield, the Western Bank

[21] Appl. No.: 750,689

[22] PCT Filed: Jun. 13, 1995

[86] PCT No.: PCT/EP95/02281

§ 371 Date: Apr. 7, 1997

§ 102(e) Date: Apr. 7, 1997

[87] PCT Pub. No.: WO95/35507

PCT Pub. Date: Dec. 28, 1995

[30] Foreign Application Priority Data

Jun. 18, 1994 [GB] United Kingdom .................... 9412245
Aug. 4, 1994 [GB] United Kingdom .................... 9415796

[51] Int. Cl.⁶ .................................................. G01R 33/02
[52] U.S. Cl. ........................................ 324/252; 360/113
[58] Field of Search ............................ 324/252, 207.21; 338/32 R; 360/113

[56] References Cited

U.S. PATENT DOCUMENTS

| | | | |
|---|---|---|---|
| 4,897,288 | 1/1990 | Jenson | 365/158 |
| 5,159,513 | 10/1992 | Dieny et al. | 324/252 |
| 5,408,377 | 4/1995 | Gurney et al. | 324/252 |
| 5,528,440 | 6/1996 | Fontana et al. | 324/252 |
| 5,576,914 | 11/1996 | Rottmayer et al. | 360/113 |

FOREIGN PATENT DOCUMENTS

| | | |
|---|---|---|
| 0490608A3 | 12/1991 | European Pat. Off. . |
| 0276784B1 | 4/1993 | European Pat. Off. . |
| 0565102A2 | 4/1993 | European Pat. Off. . |
| 0314343B1 | 8/1993 | European Pat. Off. . |
| 0646831A1 | 9/1994 | European Pat. Off. . |
| 4310318A1 | 3/1993 | Germany . |
| WO91/18424 | 5/1991 | WIPO . |

OTHER PUBLICATIONS

Theory of Giant Magnetoresistance Effects in Magnetic Layered Structures with Antiferromagnetic Coupling by R. E. Camley and J. Barnas, Physical Review Letters, 7 Aug. 1998, vol. 63, No. 6, pp. 664 to 667.

Giant magnetoresistance in soft ferromagnetic multilayers by B. Dieny, V.S. Speriosu, S.S.P. Parkin, B.A. Gurney, D.R. Wilhoit, and D. Mauri; 8073b Physical Review B: Condensed Matter 43(1991)1, Jan., No. 1, Part B, New York, US; vol. 43, No. 1; 1 Jan. 1991.

Magnetoresistance in magnetic manganeses oxide with intrinsic antiferromagnetic spin structure by Ken–ichi Chahara, Toshiyuki Ohno, Masahiro Kasai, and Yuzoo Kozono—Hitachi Research Laboratory, Hitachi Ltd., Hitachi 319–12, Japan; Appl. Phys. Lett. 63 (14); 4 Oct. 1993.

Giant Negative Magnetoresistance in Perovskitelike $La_{2/3}Ba_{1/3}$ Ferromagnetic Films by R. von Helmolt, J. Wecker, B. Holzapfel, L. Schultz, and K. Samwer; Physical Review Letters, vol. 71, No. 14; 4 Oct. 1993; pp. 2331 to 2333.

*Primary Examiner*—Jay M. Patidar
*Attorney, Agent, or Firm*—Sheldon & Mak

[57] ABSTRACT

A magnetic field responsive device which includes: an electrically insulating substrate (2), a layer of an electrically conductive soft magnetic material (3), a layer of giant magneto-resitive (GMR) material (5) arranged in electrical contact with ethe layer of electrically conductive soft magnetic material, the thickness of the GMR material layer being not greater than twice the mean free path of an electron in the said GMR material, the layers being arranged in any order or position on the substrate and having opposed directions of mangetisation in zero magnectic field.

30 Claims, 2 Drawing Sheets

MAGNETIC FIELD RESPONSIVE DEVICE HAVING GIANT MAGNETORESISTIVE MATERIAL AND METHOD FOR FORMING THE SAME

BACKGROUND OF THE INVENTION

This invention relates to magnetic field responsive devices and is more particularly concerned with a magnetic field responsive device having improved sensitivity and performance and including one or more giant magneto resistive (GMR) materials.

A variety of magnetic field sensors have been proposed hitherto. The simplest of these are Hall Effect magnetometers in which the size of the magnetic field is derived from measurement of a transverse voltage in a current-carrying semiconductor placed in the magnetic field. Such devices are exceedingly temperature sesitive, and in fact the measured values are exponentially dependent upon temperature. Classical magneto resistive materials, such as nickel iron, have also been used for stray field pick up, but such devices are too insensitive for many applicaitons.

Flux-gate magnetometers are also used to measure magnetic fields. In these devices a soft magnetic material is excited with an AC excitation field, with the response, as modified by the ambient field, being observed.

Layered sandwich-type magneto resistive devices comprising at least two deposited layers of magnetic thin films separated by a non-magnetic thin film layer have been proposed for use as magnetic memory cells and magnetoresistive read transducer assemblies. Examples of such devices are illustrated in European Patent Specifications Nos. 0276784 and 0314343, U.S Pat. No. 4,897,288 and International Patent Application No. WO91/18424, the entire disclosure of which are incorporated herein by reference.

Giant magneto resistive (GMR) materials of the iron chromium or cobalt copper type have been proposed for use in magnetic field sensors. The sensitivity of such devices incorporating GMR materials may be improved by the use of layered sandwich-type structures, but again the change in the electrical resistance at low magnetic fields is not enough for many applicaitons. In high fields at room temperature, however, a 60% δR/R is achievable.

Other magneto resistive materials which have been suggested include cobalt silver, but this is a very fine grain material and inherently magnetically hard. It is only useful in devices for measuring high magnetic field strengths.

In Phys Rev Lett 71 (1993) 2331, the entire disclosure of which is incorporated herein by reference, there is described a GMR material comprising a mixed oxide of lanthanum, barium and manganese with which a δ/R of 97% was achieved at room temperature in high fields.

None of the magnetic field sensors which have hitherto been proposed have achieved the combination of sensitivity, size and ease of manufacture necessary for many applications and any improvement in this respect would be hight desirable.

SUMMARY OF THE INVENTION

According to the present invention there is provided a magnetic field responsive device which comprises an electrically conductive soft magnetic material and a giant magneto resistive material proximate thereto and in electrical contact therewith.

In one aspect the invention provides a magnetic field responsive device which comprises:

an electrically insulating substrate;
a layer of an electrically conductive soft magnetic material,
a layer of a gient magneto resistive (GMR) material arranged in electrical contact with the layer of electrically conductive soft magnetic material, the thickness of the GMR material layer being not greater than twice the mean free path of an electron in the said GMR material, the layers being arranged in any order or position on the substrate and having opposed directions of magnetisation in zero applied magnetic field.

In another aspect the invention provides a method of manufacturing a magnetic field resposive device which comprises:

depositing onto an electrically insulating substrate, in any order,
(i) an electrically conductive layer of a soft magnetic material,
(ii) a layer of a giant magneto resistive (GMR) material, of a thickness not greater than twice the mean free path of an electron in the GMR material,
the layers being deposited so as to be in electrical contact and,
if necessary, treating the layers such that they have opposed directions of magnetisation in zero applied magnetic field.

The magnetic field responsive device can be, for example, a magnetic field sensor, a proximity sensor, a security device, a magneto resistive read transducer, a flux gate magnetometer or a direction finding device.

the electrically insulating substrate preferably has a smooth, and more preferably, a flat surface and can comprise, for example, a glass, a silicon wafer, a plastics material, or any other suitable electrically insulating layer, film or surface.

In this specification, a soft magnetic material is one which has its direction of manetisation changed in low magnetic fields, of the order of, for example, less than about 1000 Amps per meter. The electrically conducting soft magnetic material can be any suitable ferro-magnetic material or alloy, and for example very good results have been obtained with alloys of iron with for example, nickel and/or cobalt. The preferred soft magnetic material is $Ni_3Fe$.

In principle any sjuitable GMR material, preferably with low electrical conductivity, can be used in the devices of the invention. Preferably the GMR material is a semi-conductor or an electrical insulator, for example a magnetic oxide, such as, for example iron oxide; or a mixed oxide of lanthanum, a Group IIa metal, and manganese, such as, for example, lanthanum, barium, manganese oxide; lanthanum, calcium, manganese oxide; or lanthanum, strontium, manganese oxide. Particulary good results have been obtained using a lanthanum, barium, manganese mixed oxide of the type mentioned heretofore.

A plurality of layers of soft magnetic material and GMR matierial may be used if desired. The layers of soft magnetic material and GMR material are arranged on the substrate such that an electric current passing through the layers must pass through alternately a layer of soft magnetic material and a layer of GMR material.

In a first, preferred embodiment, the substrate, and the one or more layers of soft magnetic material layer and GMR material can, for example, be arranged in a sandwich type layered construction on the substrate.

The preferred GMR oxide materials are semi-conductors or insulators and thus it is important that the thickness of the layer, or each of the layers, of GMR material is sufficiently small to enable electrons to pass transversely through the GMR material. Preferably the thickness of the, or each, layer is not greater than one and a half times the distance of the mean free path of an electron in the GMR material, and most preferably the thickness is equal to or less than the mean free path of an electron in the GMR material. In general, this requires the thickness of the layer or layers to be around 10 to 100 lattice spacings (0.2$\mu$), and preferably from 500–1500 angstroms, at at least one point.

The thickness of the layer, or each of the layers, of soft magnetic material is preferably also small, but in this case the thickness is not so critical, and for example thicknesses of from 1 to 100$\mu$ have been found to be suitable.

In a second preferred embodiment, the magnetic field responsive device comprises:

an electrically insulating substrate, an electrically soncuctive layer on the substrate, the layer comprising a plurality of elongate strips of an electrically conductive soft magnetic material and a giant magneto resistive (GMR) material arranged alternately and side by side with their adjacent surfaces in electrical contact, the width of each of the strips of GMR material in the plane of the electrically conductive layer being not greater than twice the mean free path of an electron in the said GMR material, and the adjacent strips of soft magnetic material and GMR material having opposed directions of magnetisation is zero applied magnetic field.

In this aspect of the invention such a device may be manufactured by a method which comprises:

depositing an electrically conductive layer of a soft magnetic material onto a substrate, removing thin elongate strips of the soft magnetic material at intervals so as to form vias in the layer thereby producing in the layer elongate strips or mesas of soft magnetic material electrically insulated from each other by the vias, depositing an electrically insulating giant magneto resistive (GMR) material onto the layer so as to fill, or at least bridge, the vias in the layer, the width of each of the vias at at least one point along its length being not greater than twice the mean free path of an electron in the GMR material, and if necessary, treating the layer such that adjacent strips or mesas of soft magnetic material and strips of GMR material filling or bridging the vias have opposed directions of magnetisation in zero applied magnetic field.

The strips or mesas of soft magnetic material and GMR material strips or filled vias are arranged alternately on the substrate such that an electric current passing across the layer must pass through alternate mesas of soft magnetic material and vias of GMR material. The width of each of the vias is sufficiently small to enable electrons to poss through the deposited layer of GMR material filling or bridging the via. Preferably the width of each via is not greater than one and a half times the mean free path of an electron in the GMR material, and most preferably the dwidth is equal to or less than the mean free path of an electron in the GMR material. In general, this requires the width of the vias to be around ten to one hundred lattice spacings (0.2$\mu$) at at least one point.

The thickness of the deposited soft magnetic layer is preferably small, consistent with the layer having a suitable electrical resistance. Thicknesses of about 0.1 to about 5 microns can be used, but preferably the thickness is around 1 micron.

The width of each of the strips of mesas of soft magnetic material is preferabley also small, and for example widths of from 1 to 100$\mu$ have been found to be suitable.

In some preferred devices according to the invention the soft magnetic material may be in intimate physical contact with the GMR material although this is not essectial. Adjacent surfaces of soft magnetic material and GMR material can, for example, be separated by a thin layer of an electrically conductive metallic material, for example, a noble metal such as copper, silver or gold. Where such a separation layer is used, this is preferably a "flash" layer of, for example, gold, of a few nonometers thichness.

Electrodes can be attached to the device by any suitable means. An electrode may, for example be soldered onto the layer of soft magnetic material, or attached by means of a conductive adhesive. An electrode may be attached to the layer of GMR material by, for example, applying a flash layer of a conductive material, for example, gold, and then soldering or applying a conductive adhesive to make the electrical connection.

Although the invention is not intended to be bound by any particular theory, it is believed that by arranging for the soft magnetic material and GMR material to have opposed directions of magnetisation in zero applied magnetic field the conduction of electrons through the GMR material is assisted when the magnetism of the soft magnetic material is reversed, thereby increasing the efficiency of the device. If necessary the layers may be treated to ensure that the directions of magnetisation are opposed, by, for example, applying a magnetic field of sufficient intensity to change the direction of magnetisation of the soft magnetic material in a zero applied magnetic field.

In the method of the invention the layer of soft magnetic material is preferably deposited onto the substrate, or the GMR material, by any of the known deposition techniques, for example, sputtering, molecular beam epitaxy, electrodeposition, or laser ablation, until a layer of up to about 100$\mu$ thickness has been obtained.

The mesas and vias are preferably obtained by an etching process, and lithographic techniques such as electron beam lithography or possibly X-ray lithography can be used. In electron beam lithography a mask is first used to make a pattern on the surface and the mesas and vias formed by plasma etching. The vias need not be parallel sided, and for example it may be advantageous for the vias to become progressively narrow in width towards their bottom, that is, approaching the substrate. It is important to arrange, however, that none of the soft magnetic material bridges the vias to avoid non-optimal exchange coupling between the magnetic materials.

The GMR material may be deposited onto the surface of the substrate, or the soft magnetic material layer, by any suitable technique, but preferably deposition is by laser ablation. Sputtering may be used in some cases, but is not usually preferred.

The GMR material may also be deposited onto the surface of the etched layer of soft magnetic material by any suitable technique, but preferably deposition is by laser ablation. This process is highly directional and can therefore more easily fill the vias with the GMR material.

It has been found in practice that it is highly desirable to deposit the GMR material onto a layer of a suitable, lattice matched oxide. Suitable oxides include, for example, yttrium/barium/copper oxide (preferably in its metallic rather than its superconducting phase). The method of the invention therefore preferably includes the step of depositing a layer of a lattice matched oxide before the deposition of the GMR material.

After the deposition of the layers, the entire device may be annealed if desired, for example at a temperature of from 100 to 600° C.

BRIEF DESCRIPTION OF THE DRAWINGS

Preferred embodiments of magntic field responsive devices according to the invention will now be described by way of example with reference to the accompanying Drawings in which.

DESCRIPTION OF THE PREFERRED EMBODIMENT

Figure 1:
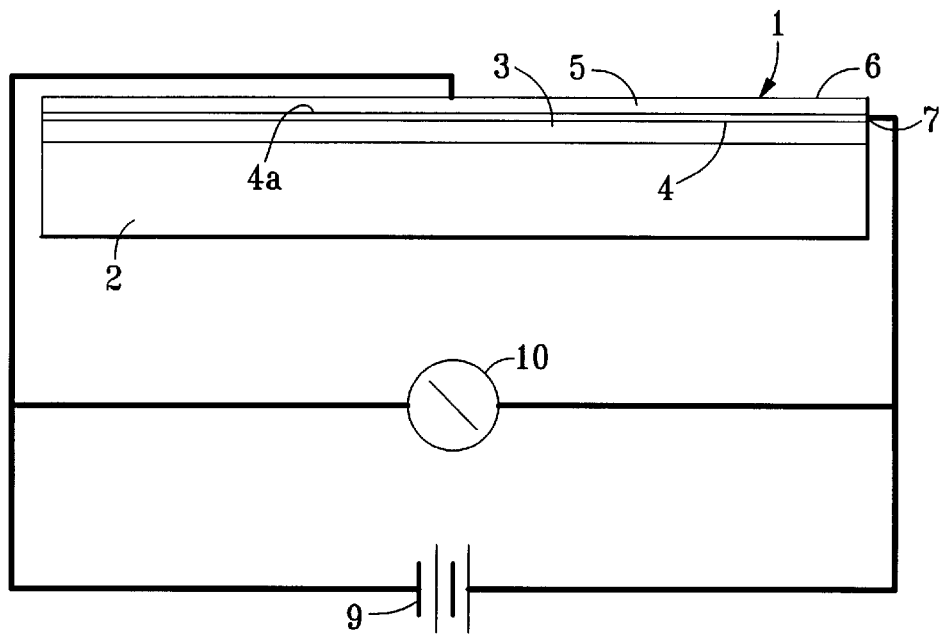
FIG. 1 shows a diagrammatic representation of a first device in sectional side elevation.
Figure 2:
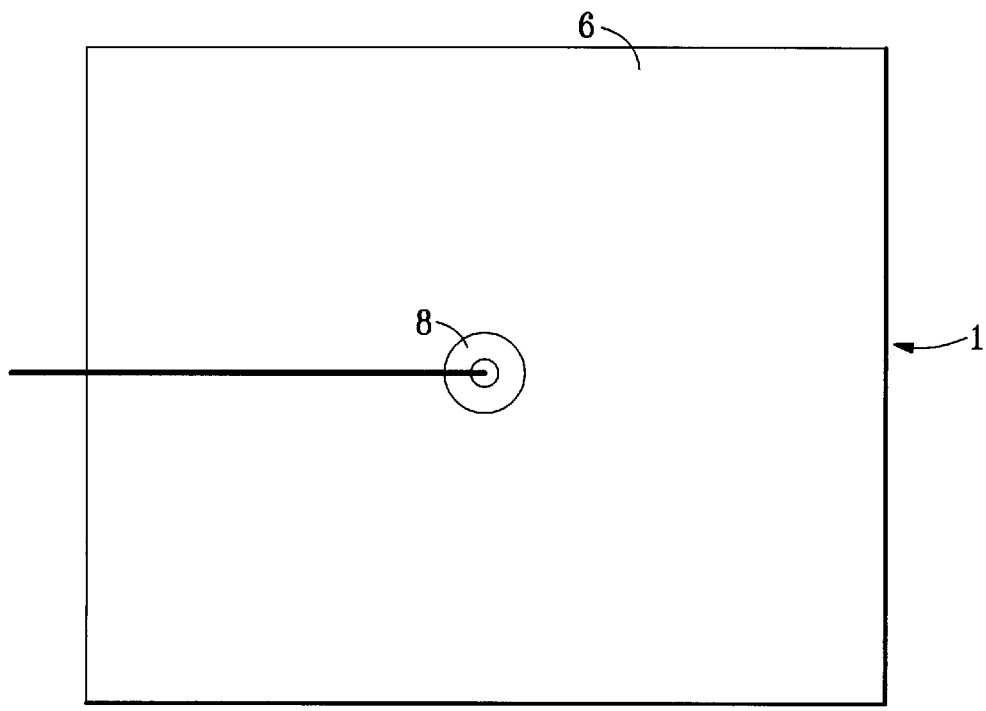
FIG. 2 shows the device of FIG. 1 in plan view.

Referring to the Drawings, the first device, illustrated generally at 1, comprises an electrically insulating silicon wafer substrate 2 having deposited thereon by a sputtering technique a $1\mu$ thick layer 3 of nickel iron $Ni_3Fe$.

A flash coating 4 of a noble metal such as gold, titanium or tantalum of 1 to 100 nanometers thickness may then be applied to the deposited $Ni_3Fe$ layer by vapour deposition. The flash-coated $Ni_3Fe$ layer is next coated with a thin layer of yttrium, barium, copper oxide 4a, followed by deposition of a GMR material layer 5 by laser ablation.

The laser-ablated GMR material is a mixed oxide of lanthanum, barium and manganese as described in Phys. Re. Lett. 71 (1993) 2331, referred to previously.

A second layer of $Ni_3Fe$ (not shown) may be deposited onto the GMR material layer if desired.

Finally, a further flash coating 6 of gold, titanium or tantalum is applied to the surface of the deposited GMR material, and the device connectorised by making electrical connections 7, 8 to the nickel iron layer 3 and the gold coating 6 respectively. If necessary, the device is "poled" by applying a magnetic field of sufficient intensity to change the direction of magnetisation of the $Ni_3Fe$ layer in a zero applied magnetic field, to ensure that the magnetic layers have opposed directions of magnetisation.

To operate the device it is connected to an EMF source 9 and a coltmeter 10.

In operation, the device is placed in the magnetic field whose intensity is to be measured and the EMF source switched on. Generally an applied current of abou 1 to 10 milliamps will be suitable. The effect of the magnetic field intensity alters the number of electrons which can pass through the GMR material and thus alters the apparent resistivity. The change in potential is measured by the voltmeter and is directly related to field intensity.

Figure 3:
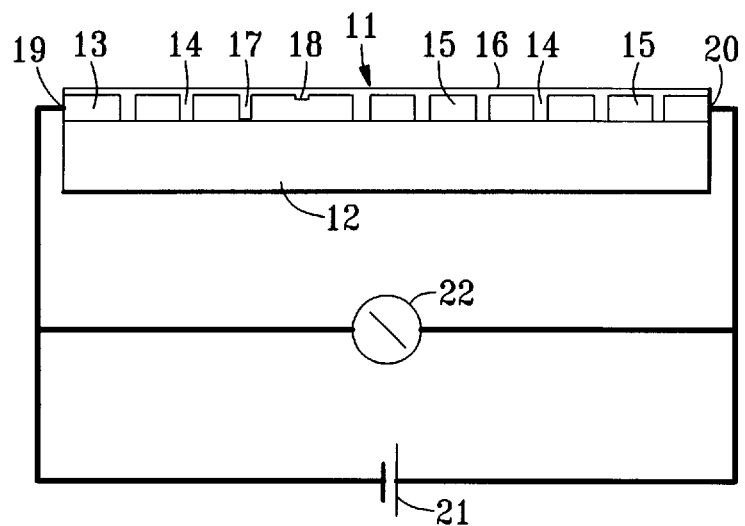
FIG. 3 shows a diagrammatic representation of a second device in sectional side elevation.
Figure 4:
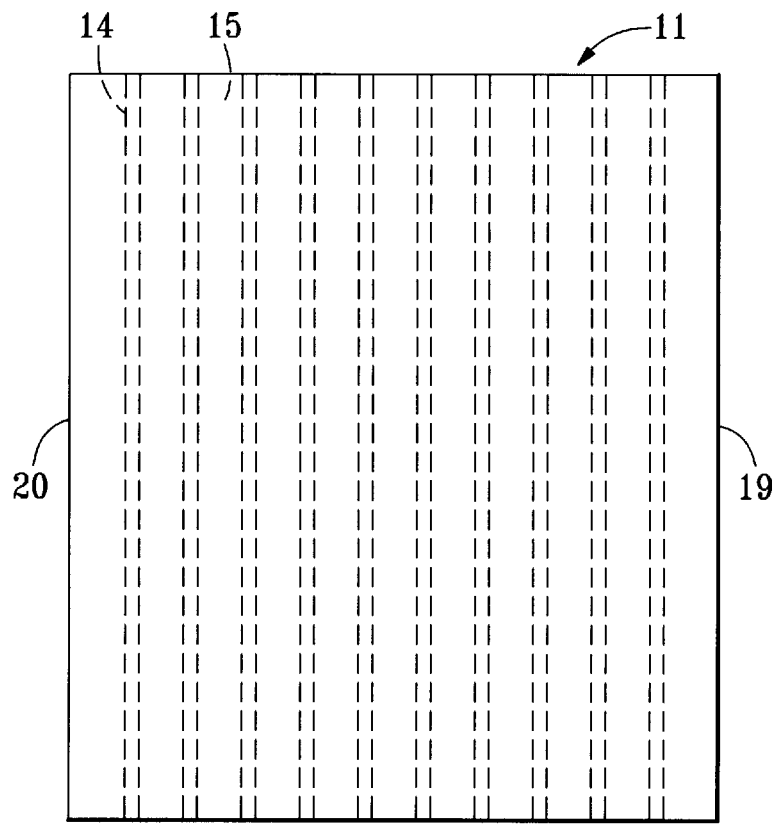
FIG. 4 shows the device of FIG. 3 in plan view.

Referring now to FIGS. 3 and 4, the second device, illustrated generally at 11, comprises a plastics film substrate 12 having deposited thereon by a sputtering technique a $1\mu$ thick layer 13 of nickel iron $Ni_3Fe$. The $Ni_3Fe$ layer has etched in its surface by electron beam lithography a plurality of parallel vias 14 which extend to the surface of the substrate 12 and insulate adjacent mesas of nickel iron 15 one from another. In the device illustrated the vias are parallel-sided, but other configurations are possible, for example the vias could become narrower in the direciton of the substrate 12.

On top of the nickel iron layer 13 there is deposited by laser ablation a GMR material layer 16 which comprises a mixed oxide of lanthanum, barium and manganese. As shown in FIG. 3 the vias can be completely filled with GMR matierial as in 17, but this is not essential, and the GMR material could only partially fill the via or simply form a bridge between adjacent mesas as illustrated in 18.

Electrical connections 19, 20 are made to the nickel iron layer, which extend to a current source 21 and a voltmeter 22.

In operation the device is placed in the magnetic field whose intensity is to be measured and subjected to an applied current of from 1 to 10 milliamps. The change in potential is measured by the voltmeter and is directly related to the magnetic field intensity.

As illustrated, the sensitivity of the device is greatest in a direction lying along the mesas. The dimensions of the device can, however, be chosed to give extreme directionality, or relative non-directionality, as desired.

All the features disclosed in this specification (including any accompanying claims, abstract and drawings), and/or all of the steps or any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

We claim:

1. A magnetic field responsive device formed at least of a series of layers which have opposed directions of magnetization, said series of layers, which comprise:
    an electrically insulating substrate;
    a layer of an electrically conductive soft magnetic material;
    a layer of giant magneto resistive (GMR) material arranged in electrical contact with the layer of electrically conductive soft magnetic material,
    the thickness of the GMR material layer being not greater than twice the mean free path of an electron in the said GMR material,
    the layers being arranged on the substrate such that the electric current passing through the layers alternately passes through a layer of soft magnetic material and the GMR oxide material and having opposed directions of magnetisation in zero applied magnetic field.

2. A magnetic field responsive device according to claim 1, which is a magnetic field sensor, a proximity sensor, a security device, a magneto resistive read transducer, a flux-gate magnetometer, or a direction finding device.

3. A magnetic field responsive device according to claim 1, in which the substrate comprises a flat surface of a glass, a silicone wafer or a plastics material.

4. A magnetic field responsive device according to claim 1, in which the soft magnetic material comprises a ferromagnetic material or alloy.

5. A magnetic field responsive device according to claim 4, in which the soft magnetic material is nickel iron.

6. A magnetic field responsive device according to claim 1, in which the GMR material is a magnetic oxide.

7. A magnetic field responsive device according to claim 6, in which the magnetic oxide is iron oxide or a lanthanum barium manganese oxide.

8. A magnetic field responsive device according to claim 1, in which the substrate and the layers of electrically conductive soft magnetic material and GMR material are arranged in a sandwich-type construction.

9. A magnetic field responsive device according to claim 8, in which the thickness of the GMR material layer is equal to or less than the mean free path of an electron is the GMR material.

10. A magnetic field responsive device according to claim 8, in which the thickness of the GMR material layer is from about 10 to about 100 lattice spacings at at least one point.

11. A magnetic field responsive device according to claim 1, in which the thickness of the soft magnetic material layer is from about 1 to about 100μ.

12. A magnetic field responsive device according to claim 1, in which the soft magnetic material is in intimate physical contact with the GMR material.

13. A magnetic field responsive device according to any of claim 1, in which adjacent surfaces of the soft magnetic material and the GMR material are separated by a thin layer of an electrically conductive metallic material.

14. A magnetic field responsive device according to claim 13, in which the separation layer comprises a noble metal.

15. The magnetic field responsive device as claimed in claim 1 wherein the GMR material is comprised of an oxide.

16. The magnetic field responsive device as claimed in claim1 wherein the GMR material is an oxide selected from the group consisting of iron oxide, mixed oxides of lanthanum and a Group IIa metal and lanthanum, strontium magnesium oxide.

17. A magnetic field responsive device to which is applied an electrical current, said magnetic field responsive device which comprises:
   an electrically insulating substrate;
   an electrically conductive layer on the substrate comprising a plurality of strips of an electrically conductive soft magnetic material lying in a plane;
   giant magneto-resistive (GMR) material strips arranged alternately in side by side relationship and in electrical contact with said electrically conductive strips,
   the width of each of the strips of GMR material lying in the plane of the electrically conductive layer being not greater than twice the mean free path of an electron in the said GMR material, and
   the adjacent strips of soft magnetic material and GMr material having opposed direcitons of magnetization in zero applied magneti field.

18. A magnetic field responsive device according to claim 17, in which the strips of electrically conductive soft magnetic material and GMR material are arranged respectively in a series of alternating mesas and vias.

19. A magnetic field responsive device according to claim 18, in which the width of each via is equal to or less than the mean free path of an electron in the GMR material.

20. A magnetic field responsive device according to any of claim 19, in which the width of each of the strips of soft magnetic material is from 1 to 100μ.

21. A magnetic field responsive device according to claim 18, in which the width of each of the vias is from about 10 to about 100 lattice spacings at at least one point.

22. A magnetic field responsive device according to any of claim 17, in which the thickness of the strips of electrically conductive soft magnetic material is from about 0.1 to about 5μ.

23. A mehtod of manufacturing a magnetic field responsive device adopted to have applied a current comprising the steps of:
   depositinting onto an electrically insulating substrate, in any order,
   (i) an electrically conductive layer of a soft magnetic material
   (ii) a layer of a giant magneto resistive (GMR) material of a thickness at at least one point of not greater than twice the mean free path of an elctron in the GMR material,
   the layers being deposited so as to be in electrical contact,
   controlling the direction of magnetization in the layers such that they have opposed directions of magnetisation in zero applied magnetic field by applying a magnetic field.

24. A method according to claim 23, in which the layer of soft magnetic material is deposited onto the substrate by sputtering, molecular beam epitaxy, electrodeposition, or laser ablation.

25. A method according to any of claim 23, in which the GMR material is deposited by laser ablation.

26. A method according to any of claim 23, in which, prior to the deposition of the GMR material, there is deposited a layer of a lattice matched oxide.

27. A method according to any of claim 23, in which, after the deposition of the layers, the device is annealed by heating to a temperature of from 100 to 600° C.

28. A method of manufacturing a magnetic field responsive device comprising the steps of:
   depositing an electrically conductive layer of a soft magnetic material onto a substrate,
   removing portions of the soft magnetic material in thin strips at intervals so as to form vias in the layer thereby producing in the layer strips having a thickness with mesas on the soft magnetic material electrically insulated from each other by the vias.
   depositing an electrically insulating giant magneto resistive (GMR) material onto the layer and into the vias in the layer, so that the width of each of the vias at at least one point along its length being not greater than twice the mean free path of an electron in the GMR material, and
   treating the layer such that adjacent strips or mesas of soft magnetic material and GMR material in the vias, respectively, have opposed directions of magnetisation in zero applied magnetic field.

29. A method according to claim 28, in which the mesas and vias are obtained by a lithographic etching process.

30. A magnetic field responsive device to which is applied an electrical current, said magnetic field responsive device which comprises:
   an electrically insulating substrate;
   an electrically conductive layer on the substrate comprising a plurality of strips of an electrically conductive soft magnetic material lying in a plane;
   a giant magneto-resistive (GMR) material strips arranged alternately in side by side relationship and in electrical contact with said electrically conductive strips,
   the width of each of the strips of GMR material lying in the plane of the electrically conductive layer being not greater than twice the mean free path of an electron in the said GMR material, and
   current path means associated with said electrically conductive soft magnetic material and said GMR whereby the applied current alternately passes through the conductive soft magnetic material and said GMR.

* * * * *

UNITED STATES PATENT AND TRADEMARK OFFICE
CERTIFICATE OF CORRECTION

PATENT NO. : 5,886,523
DATED : March 23, 1999
INVENTOR(S) : Gibbs, et al.

It is certified that error appears in the above-identified patent and that said Letters Patent is hereby corrected as shown below:

Column 6, line 48, delete "oxide".

Signed and Sealed this

Eighteenth Day of May, 1999

Attest:

Q. TODD DICKINSON

*Attesting Officer*  *Acting Commissioner of Patents and Trademarks*